United States Patent [19]

Kokuryo

[11] Patent Number: 4,535,295
[45] Date of Patent: Aug. 13, 1985

[54] METHOD AND DEVICE FOR CONTROLLING THE PHASE OF TIMING SIGNAL

[75] Inventor: Yoshiro Kokuryo, Kodaira, Japan

[73] Assignees: Hitachi, Ltd.; Hitachi Denshi Kabushiki Kaisha, both of Tokyo, Japan

[21] Appl. No.: 444,225

[22] Filed: Nov. 24, 1982

[30] Foreign Application Priority Data

Nov. 27, 1981 [JP] Japan .................................. 56-189305

[51] Int. Cl.³ ............................................ H03K 5/153
[52] U.S. Cl. .................................... 328/155; 307/516;
307/354; 328/55
[58] Field of Search ............... 307/514, 516, 353, 354;
328/55, 155, 139; 375/111

[56] References Cited

U.S. PATENT DOCUMENTS

| | | | |
|---|---|---|---|
| 4,114,111 | 9/1978 | Winters | 328/155 X |
| 4,216,543 | 8/1980 | Cagle et al. | 375/119 X |
| 4,246,546 | 1/1981 | McDonald | 331/25 X |
| 4,290,022 | 9/1981 | Puckette | 328/55 |
| 4,312,075 | 1/1982 | Murano et al. | 307/353 X |
| 4,339,631 | 7/1982 | Nishioka | 328/155 X |
| 4,344,179 | 8/1982 | Ryan | 328/155 X |
| 4,388,595 | 6/1983 | Brooks | 328/55 X |
| 4,431,969 | 2/1984 | Summers et al. | 328/155 |

FOREIGN PATENT DOCUMENTS 0039305  3/1977  Japan ................................... 375/111

OTHER PUBLICATIONS

Mueller et al, "Timing Recovery in Digital Synchronous Data Receivers", IEEE Trans. Comm., vol. COM-24, No. 5, May 1976, pp. 516–531.

Primary Examiner—Stanley D. Miller
Assistant Examiner—D. R. Hudspeth
Attorney, Agent, or Firm—Antonelli, Terry & Wands

[57] ABSTRACT

Disclosed is a phase control system for providing by digital processing a timing signal having a certain phase relationship with a timing signal detected in a received, modulated signal, wherein the detected timing signal is delayed by a predetermined time period and the detected timing signal and the delayed timing signal are multiplied by respective constants so that the zero-cross point of the composite signal of the two timing signals matches the sampling point of the timing signal.

7 Claims, 10 Drawing Figures

METHOD AND DEVICE FOR CONTROLLING THE PHASE OF TIMING SIGNAL

BACKGROUND OF THE INVENTION

(1) Field of the Invention

The present invention relates to a method and device for controlling the phase of a timing signal and, more particularly, to a method and device for providing by digital processing a timing signal having a predetermined phase relationship with a timing signal component which is extracted from a received, modulated signal in a data modem and the like.

(2) Description of the Prior Art

When a signal modulated in phase shift keying (PSK) modulation or quadrature modulation is received to retrieve the original signal or data by demodulation, it is necessary to extract a timing signal component from the received signal and drive the demodulation circuit by a timing pulse signal having a certain phase relationship with the timing signal component.

Recently, demodulators are changing from the conventional analog circuit arrangement to the digital circuit arrangement, and in order for the digital circuit to perform the above-mentioned timing pulse signal phase control, the timing pulse signal of the digital circuit needs to match the sampled phase of the timing signal component.

In the conventional method for the timing signal phase control by a digital circuit, the timing signal component is extracted from the received, modulated signal and sampled at a certain sampling frequency, the phase of zero level or near-zero level of the thus sampled timing signal component is detected, and the phase of the timing pulse signal is controlled so that the timing pulse signal of the signal processing circuit is timed to the zero-cross point of the sampled timing signal component. In other words, phase control is performed such that the sampling point of time coincides with the zero-cross point of the extracted timing signal component.

However, in terms of the relation between the frequency of the modulated signal and the frequency of the timing pulse signal for the signal processing circuit constituting a demodulator, there are some cases where a certain phase difference must exist between the zero-cross point of the timing signal component and the sampling point. In dealing with these cases by the conventional method which matches the zero-cross point to the sampling point, it is necessary to use a very high sampling frequency or perform interpolation between sampling points. However, the digital processing circuit carries out the process at every sampling of data, and it is undesirable to increase the sampling frequency. This is particularly the case where a microprocessor with a limited processing speed is employed. Interpolation is also undesirable, since it requires much digital processing.

SUMMARY OF THE INVENTION

Accordingly, it is an object of the present invention to realize the method of controlling the phase of a timing signal with a certain phase difference between the zero-cross point of the extracted timing signal and the timing signal of the processing circuit or the sampling point thereof without using a higher sampling frequency.

In order to achieve the above-mentioned object, the present invention contemplates to control in digital fashion the timing pulse signal phase in a signal processing circuit by detecting the zero-cross point of the timing signal component in such a way that the timing signal component extracted from a received signal is shifted in phase for a certain value of phase, the zero-cross point of the shifted timing signal component is detected, and phase control is performed so that the timing pulse signal matches the detected zero-cross point.

One preferred embodiment for shifting the timing signal component is to add a sampled signal of the extracted timing signal component multiplied by one constant to a signal of the timing signal component delayed by the sampling period and multiplied by another constant. By setting the constants appropriately, arbitrary phase difference between the sampling point and the zero-cross point can be obtained, and desired timing signal phase control can be performed without using a higher sampling frequency as will be described in the following embodiments.

These and other objects and advantages, the nature of the present invention, and its various features will appear more fully upon consideration of the various illustrative embodiments now to be described in detail in connection with the accompanying drawings.

DESCRIPTION OF THE PREFERRED EMBODIMENTS

Figure 1:
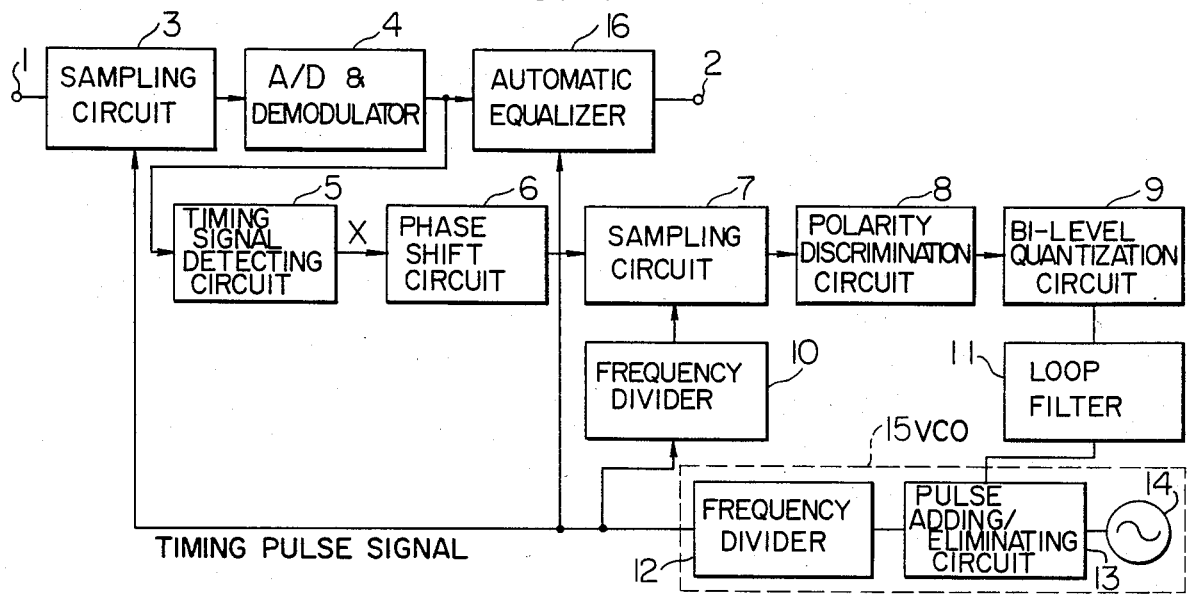
FIG. 1 is a systematic block diagram of a phase controller in a modem which employs a method of controlling the timing signal phase according to the present invention.
Figure 2:
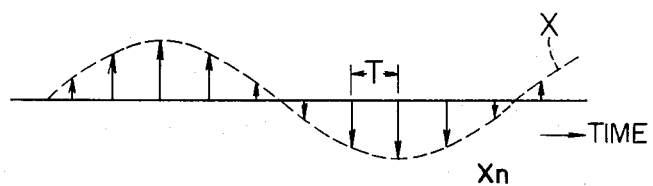
FIGS. 2 and 4 are signal waveform diagrams explaining the operation of the embodiment.

FIG. 1 shows the arrangement of the phase controller in the data modem in accordance with the inventive method of controlling the timing signal phase.

A modulated signal (e.g., as by means of quadrature modulation) received at input terminal 1 is sampled by the first sampling circuit 3 and converted into a digital base band signal by analog-to-digital (A/D) converter and demodulator 4. The base band signal is supplied to a signal processing circuit (not shown) for decoding through automatic equalizer 16 and output terminal 2, and also to timing signal detecting circuit 5. The circuit 5 is constructed by a digital filter having a narrow pass band for extracting timing signal X from the data (information) signal component, and it employs a known circuit such as that disclosed, for example, by L. E. Frank in "Carrier and Bit Synchronization in Data Communication—A tutorial Review", IEEE trans on Comumun. Vol. COM-28, No. 8, Aug. 1980. The extracted timing signal component is fed to phase shift circuit 6. The phase shift circuit 6 constitutes the principal portion for embodying the present invention, receiving the timing signal component and shifting its phase so that the zero-cross point of the timing signal component X is timed to the sampling point of the second sampling circuit 7 which will be mentioned shortly. The circuit 6 will be described in more detail later. The second sampling circuit 7 samples the output signal of the phase shift circuit at the same frequency as that of the timing signal component. Polarity descrimination circuit 8 verifies the polarity of the sampled value in co-operation with bi-level quantization circuit 9 at the same interval as that of the timing signal component so as to convert the phase-shifted signal into a bi-level signal and supplies it to loop filter 11 which provides a control signal for digital VCO 15. A zero output of the loop filter 11 indicates that the zero-cross point of the output of the phase shift circuit 6 matches the sampling point of the second sampling circuit, and a positive or negative output operates on pulse adding/eliminating circuit 13 to add or eliminate a pulse to/from pulses provided by digital pulse generator 14. The resultant pulse outputs are counted down by frequency divider 12, and a timing pulse signal including sampling pulses having a controlled phase is produced. The sampling pulse signal determines the sampling point of the first sampling circuit or the timing for the equalizer 16, and at the same time it is further counted down by frequency divider 10 so as to determine the sampling point of the second sampling circuit 7. In a particular frequency relationship, the timing signal component has a frequency of 1.6 kHz, the pulse generator 14 provides a frequency of 1 MHz, the frequency divider 12 provides the output of 9.6 kHz, and the frequency divider 10 provides the output of 1.6 kHz.

Figure 3:
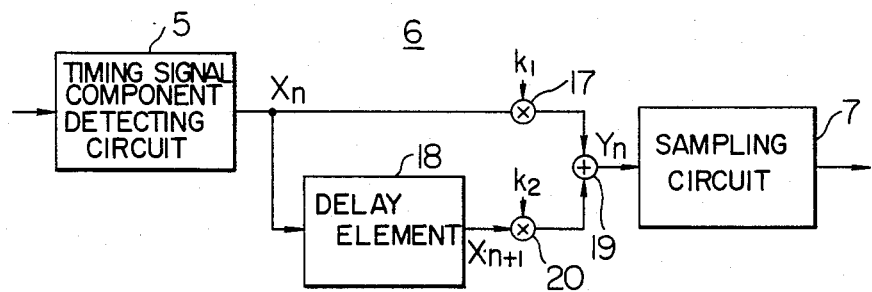
FIGS. 3, 5, 6, 7 and 8 are block diagrams of a phase shift circuit which constitutes the principal portion of the embodiments.

FIG. 3 shows the arrangement of the phase shift circuit 6, in which output signal $X_n$ from the timing signal component detecting circuit 5 is partly multiplied by constant $k_1$ by multiplier 17 and partly delayed by delay element 18 having a delay time T equal to the sampling period and multiplied by constant $k_2$ by multiplier 20. The outputs of the two multipliers are added by adder 19 to form signal $Y_n$.

The sampling signal, namely the sampled timing signal component $X_n$ provided by the sampling circuit 6, is a sinusoidal wave expressed as follows.

$$X_n = A \cos (n\omega T) \quad (1)$$

where n is an integer representing the order of sampling, A is a constant, and $\omega$ is the angular frequency of the timing signal component.

Similarly, the output $X_{n+1}$ from the delay element 18 is expressed as follows.

$$X_{n+1} = A \cos \{(n+1)\omega T\} \quad (2)$$

The output $Y_n$ from the adder 19 is expressed as follows.

$$\begin{aligned} Y_n &= k_1 X_n + k_2 X_{n+1} \quad (3) \\ &= k_1 A \cos(n\omega T) + k_2 A \cos\{(n+1)\omega T\} \\ &= A[k_1 \cos(n\omega T) + k_2 \cos\{(n+1)\omega T\} \\ &= A \sqrt{(k_1 + k_2 \cos T)^2 + k_2^2 \sin^2 T} \times \\ &\quad \cos\left(n\omega T + \tan^{-1} \frac{k_2 \sin T}{k_1 + k_2 \cos T}\right) \\ &= A' \cos(n\omega T + \phi) \end{aligned}$$

Thus the resultant signal is equal to the timing extraction component with its phase shifted by $\phi$.

where $A' = A \sqrt{(k_1 + k_2 \cos T)^2 + k_2^2 \sin^2 T}$ $$\phi = \tan^{-1} \frac{k_2 \sin T}{k_1 + k_2 \cos T}$$

Figure 4:
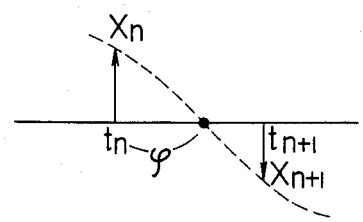

Accordingly, by controlling the timing of sampling so that $Y_n$ becomes zero by the phase control loop including the polarity discrimination circuit 8, bi-level quantization circuit 9, loop filter 11, pulse adding-/eliminating circuit 13, frequency dividers 12 and 10, and second sampling circuit 7, the zero-cross point of the input timing signal component can be set to have a timing relationship with the sampling point being of phase difference $\phi$ between contiguous sampling points $t_n$ and $t_{n+1}$ as shown in FIG. 4. The delay time T is determined depending on the sampling frequency, and the desired phase difference $\phi$ can be obtained by setting the constants $k_1$ and $k_2$ appropriately. That is to say, in case a system has the zero-cross point out of the sampling point, the phase of the timing pulse signal can be controlled to that phase relationship.

In this embodiment, the delay element is assumed to have a delay time equal to the sampling period T, however, this is not necessary, and the same result is achieved when the delay time is a multiple of the sampling period.

Figure 5:
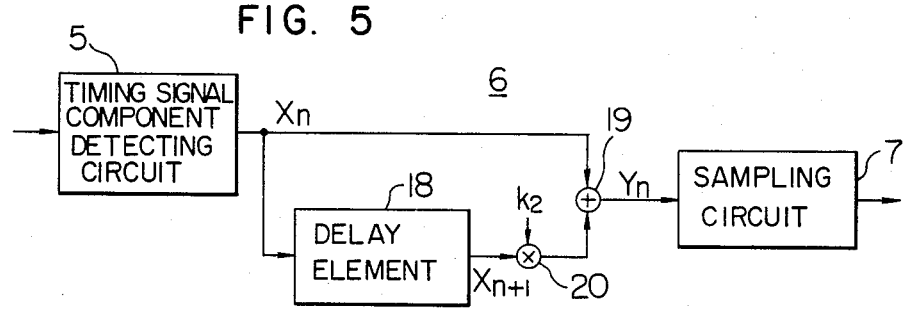
Figure 6:
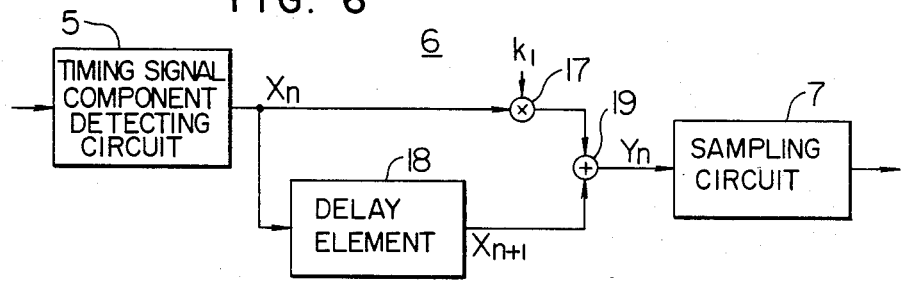
Figure 7:
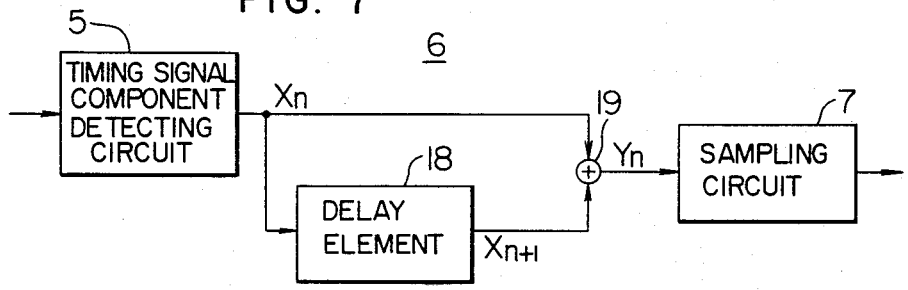

If the first constant $k_1$ is equal to 1, the multiplier 17 becomes unnecessary, allowing the arrangement of FIG. 5. Moreover, if the second constant $k_2$ is equal to 1, or both constants $k_1$ and $k_2$ are equal to 1, arrangement can be made as shown in FIG. 6 or FIG. 7. Matching of the sampling point and the zero-cross point can be achieved by making the second constant $k_2$ equal to 0 in the arrangement of FIG. 3.

Figure 8:
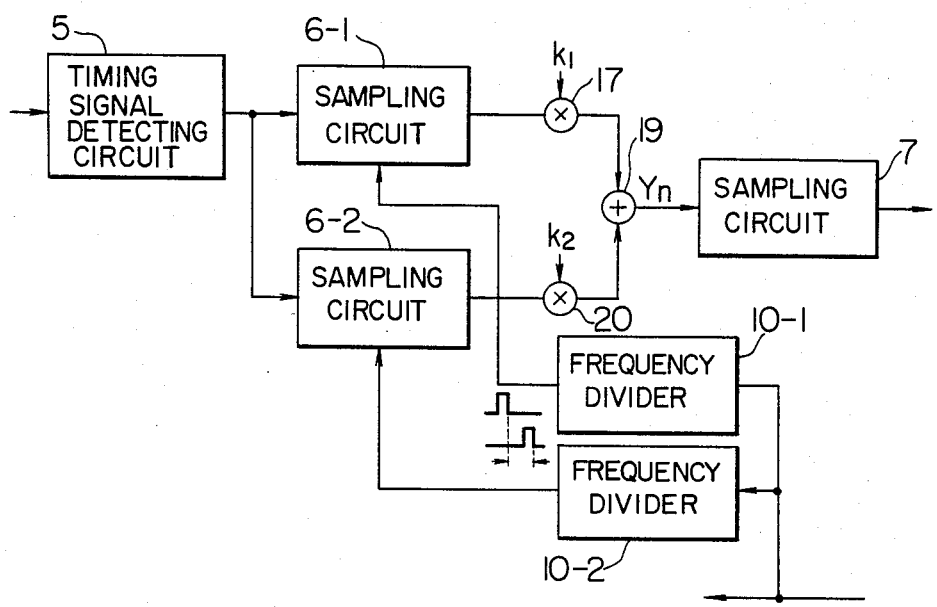

FIG. 8 shows another embodiment of the phase shift circuit, wherein the output of the timing signal detecting circuit 5 is sampled by sampling circuits 6-1 and 6-2 in response to the pulses from frequency dividers 10-1 and 10-2 having the same frequency divider, but with a phase difference of T, in place of the delay element used in the embodiment of FIG. 3. Remaining portions with the same reference numbers are the same as those of the foregoing arrangements.

Figure 9:
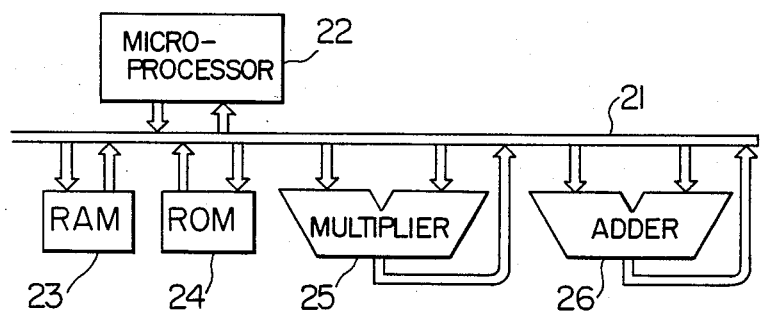
FIG. 9 is a systematic diagram of a phase shift circuit embodied by using a microprocessor.
Figure 10:
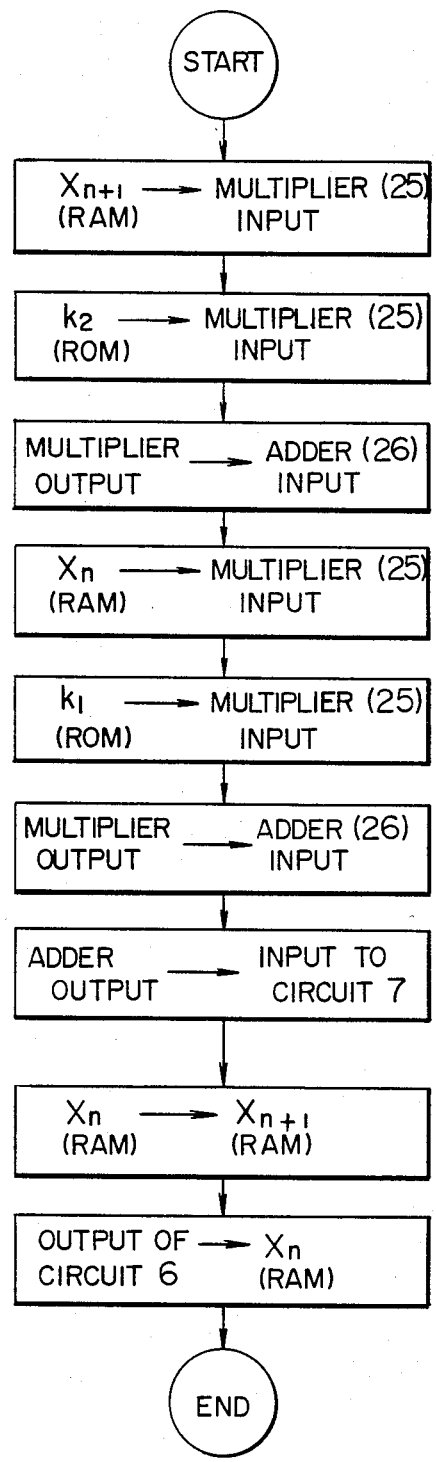
FIG. 10 is a flowchart explaining the operation of the arrangement shown in FIG. 9.

Discrete circuit arrangements for embodying the present invention have been described, however, these digital circuits can be replaced with a signal processor such as a microcomputer for carrying out the foregoing phase shift processes. Such a system arrangement is constructed, as shown in FIG. 9, by connecting through a common bus 21 a microprocessor 22, a RAM 23, a ROM 24, a multiplier 25, and an adder 26, and interfacing the system with the above-mentioned sampling circuit 6 and the polarity discrimination circuit 8 through an input/output circuit (not shown). The arrangement performs the processing as shown in the flowchart of FIG. 10 as follows. The sampled values from the sampling circuit 6 are stored via the input/output circuit into the RAM 23 sequentially at an interval of T or shorter. It will be appreciated that by executing the processes programmed shown in the flowchart at an interval of T seconds for the sampled values $X_{n+1}$ and $X_n$ in the RAM 23 and the constants $k_1$ and $k_2$ in the ROM 24, computation for the above equation (3) is carried out at every T seconds. It will further be appreciated that if the microprocessor 22 has a sufficiently high processing speed, the multiplier 25 and adder 26 can be eliminated and their functions can be performed by the software program.

As described in the foregoing embodiments, a sampled signal is phase-shifted merely by performing multiplication and addition, and the zero-cross point of the timing signal component can be set to have a certain phase relationship with the sampling point, whereby the need for a higher sampling frequency is eliminated and the need for a lot of processing for interpolation is also eliminated. Moreover, the method according to the present invention does not cause a degraded performance of phase control which would occur in the conventional system by allowing some phase error when the processing capability is limited.

It is also possible for the present invention to provide the phase relationship with the zero-cross point timed not only between the sampling points $X_n$ and $X_{n+1}$, but at any other point by setting the values of constants $k_1$ and $k_2$ in any combination of their polarity.

I claim:

1. A timing signal pulse control circuit comprising timing signal component detecting means for extracting a timing signal component from a received signal, a sampling circuit which samples said timing signal component in response to the output pulses of a digital signal generator, means including a phase shift circuit for shifting the phase of the output signal from said sampling circuit, detection means for detecting the zero-cross point of the phase-shifted signal produced by said phase shift circuit, and control for controlling the phase of the output of said digital signal generator in response to the output of said detection means so that the output pulses of said digital signal generator are produced at the zero-cross points of the phase shifted signal produced by said phase shift circuit.

2. A timing signal phase control circuit according to claim 1, wherein said phase shift circuit comprises first multiplying means for multiplying the output signal of said sampling circuit by a first constant, delay means for delaying the output signal of said sampling circuit by a multiple of a sampling period, second multiplying means for multiplying the output of said delay means by a second constant, and adding means for adding the outputs of said first and second multiplying means to produce said phase shifted signal.

3. A method of controlling the phase of a timing pulse signal in a signal processing system by extracting a timing signal component from a received signal and providing a certain phase difference between the timing pulse signal and a zero-cross point of said timing signal component, comprising:

(a) multiplying a sampled signal of said timing signal component by a first constant;
(b) delaying said sampled signal by a multiple of the sampling period at which said sampled signal is obtained from said timing signal component;
(c) multiplying said delayed sampled signal by a second constant;
(d) adding the two signals obtained by steps (a) and (c) in order to obtain a phase shifted timing signal; and
(e) producing said timing pulse signal having a pulse which coincides with the zero-cross point of said phase shifted timing signal.

4. A timing signal control circuit comprising:

(a) digital signal generator means for providing timing pulses to be used for sampling and signal processing;
(b) sampling means for sampling a received signal in response to said timing pulses;
(c) means including a timing signal component detecting circuit connected to said sampling means for extracting a timing signal component from the output of said sampling means;
(d) phase shift means connected to said timing signal component detecting circuit for shifting the phase of said timing signal component;
(e) detection means for detecting the zero-cross point of the phase-shifted timing signal component produced by said phase shift means; and
(f) control means for controlling the digital signal generator means in response to the output of said detection means so that the phase of the timing pulses produced by said digital signal generator means coincides with the zero-cross point of the phase-shifted timing signal component.

5. A timing signal phase control circuit according to claim 4, wherein said phase shift means comprises:
first multiplying means for multiplying the output of said timing signal component detecting circuit by a first constant;
delay means for delaying the output signal of said timing signal component detecting circuit by a multiple of a sampling period;
second multiplying means for multiplying the output of said delay means by a second constant; and
adding means for adding the outputs of said first and second multiplying means in order to obtain said phase-shifted signal.

6. A timing signal phase control circuit according to claim 5, wherein at least one of said first and second constants is equal to one.

7. A timing signal phase control circuit according to claim 4, wherein said detection means comprises a polarity discrimination circuit which discriminates the polarity of the output of said phase shift means at a sampling interval, and said control means for controlling said digital signal generator means comprises quantization means for transforming the output of said polarity discrimination circuit into a bilevel signal, means including a loop filter for filtering the output of said quantization means, and means including a pulse adding/eliminating circuit which adds or eliminates a pulse to/from output pulses from said digital signal generator means in response to the output of said loop filter.

* * * * *